(12) United States Patent
Liu et al.

(10) Patent No.: US 9,281,192 B2
(45) Date of Patent: Mar. 8, 2016

(54) CMP-FRIENDLY COATINGS FOR PLANAR RECESSING OR REMOVING OF VARIABLE-HEIGHT LAYERS

(71) Applicant: Taiwan Semiconductor Manufacturing Co., Ltd., Hsin-Chu (TW)

(72) Inventors: Wen-Kuei Liu, Xinpu Township (TW); Teng-Chun Tsai, Hsinchu (TW); Kao-Feng Liao, Hsinchu (TW); Yu-Ting Yen, Kaohsiung (TW); Yu-Chung Su, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/276,168

(22) Filed: May 13, 2014

(65) Prior Publication Data

US 2015/0262812 A1    Sep. 17, 2015

Related U.S. Application Data

(63) Continuation-in-part of application No. 14/208,697, filed on Mar. 13, 2014.

(51) Int. Cl.
*H01L 21/302* (2006.01)
*H01L 21/027* (2006.01)
(Continued)

(52) U.S. Cl.
CPC ...... *H01L 21/0274* (2013.01); *H01L 21/28008* (2013.01); *H01L 21/31133* (2013.01)

(58) Field of Classification Search
CPC ............ H01L 21/3105; H01L 21/3212; H01L 21/845; H01L 21/76025; H01L 21/762; H01L 21/02529; H01L 21/02178; H01L 21/02126; H01L 21/28079; H01L 21/467; H01L 21/8239; H01L 21/3116; H01L 21/67069; H01L 27/0924; H01L 51/0034
USPC ......... 438/692, 636, 700, 780, 706, 740, 769; 257/E21.006, E21.007, E21.027, 257/E21.051, E21.058, E21.077, E21.267, 257/E21.231, E21.264, E21.304, E21.613
See application file for complete search history.

(56) References Cited

U.S. PATENT DOCUMENTS 6,696,333 B1    2/2004  Zheng et al.
7,579,248 B2 *  8/2009  Huang et al. ................. 438/300
(Continued)

FOREIGN PATENT DOCUMENTS

JP    2009194242 A    8/2009

OTHER PUBLICATIONS

Farkhanda Ana, et al. "Gate Workfunction Engineering for Deep Sub-Micron MOSFET's: Motivation, Features and Challenges" ECE, National Institute of Technology, Srinagar, India, IJECT, vol. 2, Issue 4, Oct.-Dec. 2011.
(Continued)

*Primary Examiner* — David Nhu
(74) *Attorney, Agent, or Firm* — Eschweiler & Associates, LLC

(57) ABSTRACT

An IC device manufacturing process effectuates a planar recessing of material that initially varies in height across a substrate. The method includes forming a polymer coating, CMP to form a planar surface, then plasma etching to effectuate a planar recessing of the polymer coating. The material can be recessed together with the polymer coating, or subsequently with the recessed polymer coating providing a mask. Any of the material above a certain height is removed. Structures that are substantially below that certain height can be protected from contamination and left intact. The polymer can be a photoresist. The polymer can be provided with suitable adhesion and uniformity for the CMP process through a two-step baking process and by exhausting the baking chamber from below the substrate.

20 Claims, 16 Drawing Sheets

(51) Int. Cl.
*H01L 21/311* (2006.01)
*H01L 21/28* (2006.01)

(56) References Cited

U.S. PATENT DOCUMENTS

| | | | | |
|---|---|---|---|---|
| 8,084,193 | B2 * | 12/2011 | Cheng et al. | 430/326 |
| 8,525,267 | B2 | 9/2013 | Wang et al. | |
| 8,574,990 | B2 | 11/2013 | Liao et al. | |
| 8,809,139 | B2 * | 8/2014 | Huang et al. | 438/197 |
| 2003/0129540 | A1 | 7/2003 | Sheu et al. | |
| 2013/0040238 | A1 | 2/2013 | Chen et al. | |
| 2013/0193526 | A1 | 8/2013 | Lo et al. | |
| 2013/0249019 | A1 | 9/2013 | Kelly et al. | |
| 2013/0285141 | A1 | 10/2013 | Kuo et al. | |
| 2013/0307088 | A1 | 11/2013 | Yang et al. | |

OTHER PUBLICATIONS

U.S. Appl. No. 14/208,697, filed Mar. 13, 2014.

* cited by examiner ically variable material over a substrate surface. Topographically variable means that the material varies in height across the substrate. The verb "recess" is used herein to mean to cause to recede by removing an outer or uppermost portion. Recessing does not require that the material be lowered past another material or indented. Planar recessing means that the material is recessed to an approximately planar surface, whereby any of the material above the plane is substantially removed and any of the material below the plane is left substantially intact. In some embodiments, the removal is top-down meaning the removal is sequential from highest over the substrate to lowest with the removal front corresponding approximately with a plane descending toward the substrate surface. In some embodiments, the material is removed completely. In some embodiments, the material is removed from the surface of another material, which is a material that is susceptible to damage or is made non-planar by chemical mechanical polishing (CMP). In some embodiments, the topographically variable material is recessed to within a target range for height. In some embodiments, the material is recessed within another material that is substantially unaffected by the recessing process. In some embodiment, a plurality of topographically variable materials are recessed simultaneously.

FIG. 1 provides an example process 100 in accordance with some embodiments of the present disclosure. FIGS. 2-6 illustrate an example integrated circuit device 200 undergo-
CMP-FRIENDLY COATINGS FOR PLANAR RECESSING OR REMOVING OF VARIABLE-HEIGHT LAYERS

PRIORITY CLAIM AND CROSS-REFERENCE

This application is a continuation-in-part of U.S. application Ser. No. 14/208,697, filed Mar. 13, 2014.

BACKGROUND

The present disclosure relates to integrated circuit (IC) device manufacturing processes especially replacement gate processes.

In an effort to increase device densities, many years of research have been devoted to reducing critical dimensions (CDs) in semiconductor devices. This research has led to a long felt need to replace traditional gate materials with high-k dielectrics and metal gates. High-k dielectrics can provide enhanced capacitance in comparison to an equivalent thickness of silicon dioxide. Metal electrodes with suitable work functions can avoid charge carrier depletion proximate the electrode interface with the high-k dielectric. The electrodes for P-channel and N-channel transistors generally require different metals.

Suitable metals for gate electrodes can be adversely affected by processing used to form source and drain regions. In particular, annealing can cause an undesirable shift in the work function of electrode metals. This has led to the development of various new processes, including replacement gate (gate-last) processes. In a replacement gate process, a dummy gate stack is formed, which is a gate stack formed using polysilicon or other material in place of the gate metals. After source and drain regions are formed, the polysilicon is removed to form trenches which are then filled with the desired metals.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
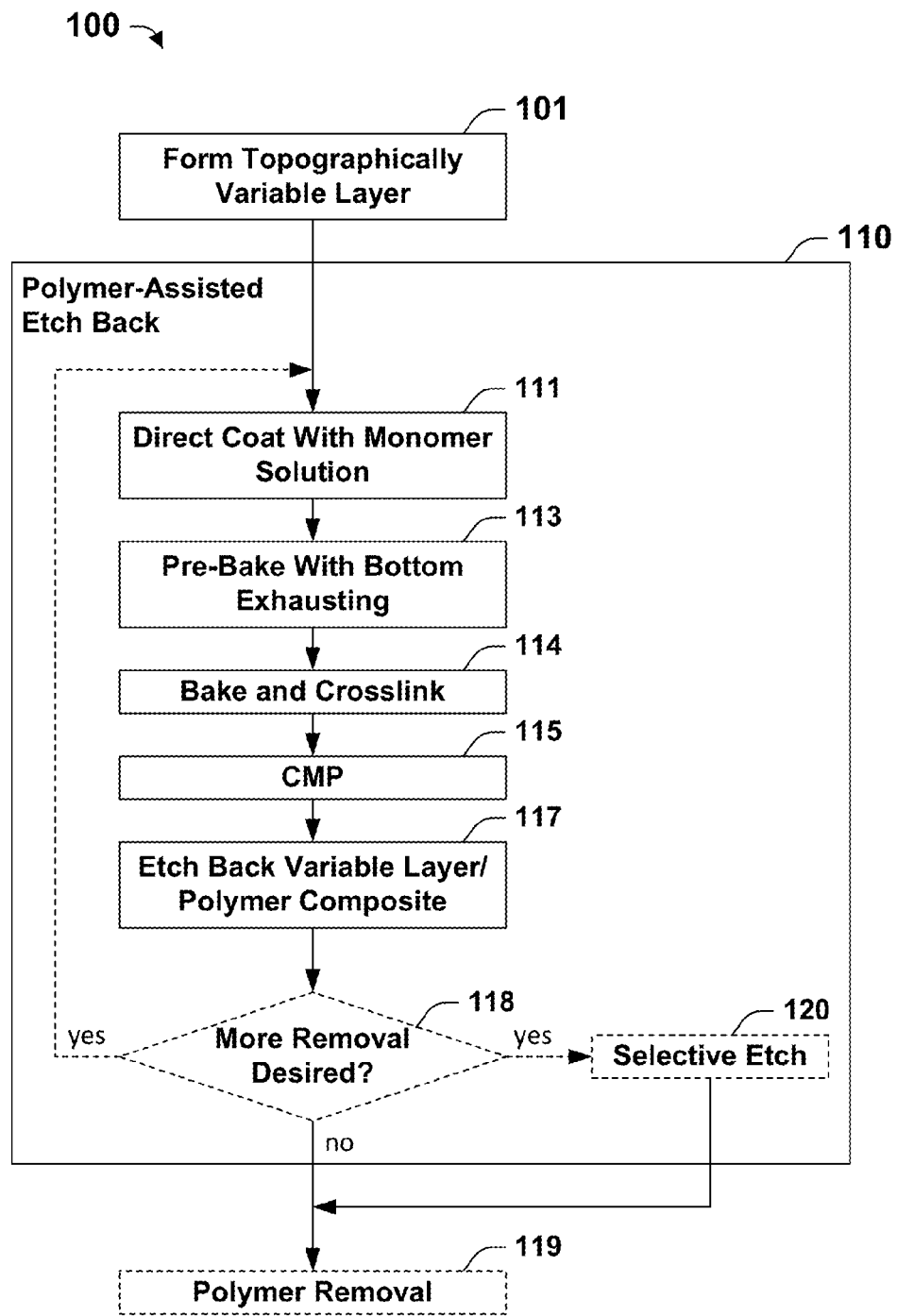
FIG. 1 is a flow chart of an integrated circuit device manufacturing process in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Optimizing integrated circuit designs to make efficient use of chip area, minimize power requirements, and maximize speed often results in designs featuring a mixture of transistor types including N-channel and P-channel, standard voltage and low voltage, and long channel and short channel. This mixture of types, and the variation in pattern density across the chip surface, result in variations in thickness and height in various material layers formed over the course of integrated circuit device manufacturing. These variations are particularly difficult to manage in replacement gate processes where the thicknesses of some layers can be affected by the height or depth to which a removal process has recessed a previously deposited layer.

Figure 2:
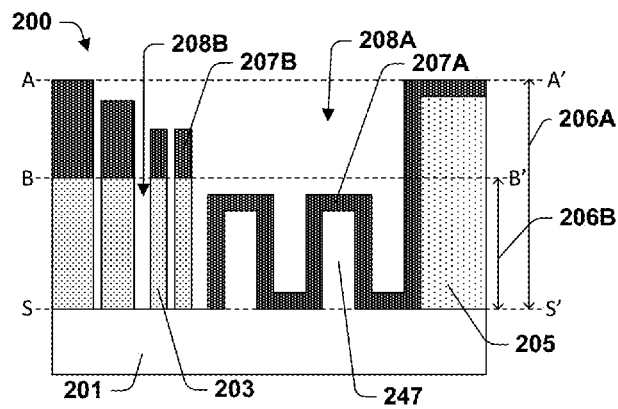
FIGS. 2-6 illustrate a partially manufactured integrated circuit device undergoing processing in accordance with some embodiments of the process illustrated by FIG. 1.

The present disclosure provides processes that effect a planar recessing of a topograph ing process 100. Process 100 includes action 101, which is initial processing that produces topographically variable layers 207A and 207B as shown in FIG. 2. Process 100 includes a series of actions 110 that form a uniformly recessed photoresist 209, or other polymer coating, and effectuate a planar recessing or removal of layer 207A or 207B. Process 100 uses a gap-filling polymer coating that remains stable under CMP. The polymer coating is planarized by CMP then further recessed by etching.

As shown in FIG. 2, layers 207 (layers 207A and 207B collectively) are formed over a substrate 201, a layer 203, and a layer 205. Layer 203 is an example of a material that would be damaged by CMP or that does not planarizes well under CMP. Layer 205 is an example of a material that can be left substantially unaffected by recessing processing 110 and within which layers 207 can be recessed. In some embodiments, substrate 201 includes fins 247.

Initially, both layer 207A and layer 207B are at height 206A over substrate 201. In this example, the height of substrate 201 is represented by the line S-S', which is at the base of fins 247. It should be appreciated that the height of substrate 201 is merely a reference plane for defining heights and that the plane identified with the line S-S' is only one example of a suitable reference plane. A plane through the tops of fins 247 could also provide a suitable reference plane. In most embodiments, substrate 201 is a wafer. A plane through the center of the wafer, or on a face of the wafer at some point in processing, could also provide a suitable reference plane.

The surface of device 200 including layers 207 has gaps 208. In some embodiments, a layer 207 that is to be made to recess has a pattern density that varies across substrate 201. In some embodiments, a layer 207 has a pattern density that varies with height continuously or in multiple steps between its density in the plane A-A', which is at the initial height 206A of layers 207, and its density in the plane B-B', which is at the lower, target height 206B for layers 207. Variations in pattern density across substrate 201, variation in pattern density with height, and gaps 208 are challenges to recessing a layer 207 in a planar fashion. Processes provided by the present disclosure are suited to meeting those challenges.

Layers 207 can be any of a wide variety of materials. In some embodiments, a layer 207 is a hard mask material. In some embodiments, a layer 207 is a metal. These materials can be more difficult to recess in a planar fashion than some other materials.

Figure 3:
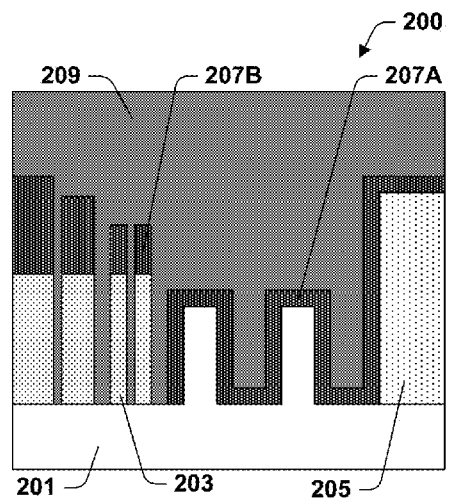

Processing 110 begins with act 111, filling gaps 208 and coating layers 207 with a monomer-containing solvent solution 209 as shown in FIG. 3. In some embodiments, solution 209 is spin coated onto substrate 201. In some embodiments, solution 209 is a photoresist solution. In some embodiments, solution 209 is a bottom anti-reflective coating solution. Although these solutions are not being used for their intended purpose, their well characterized properties, which have been optimized for use in integrated circuit device manufacturing, provide an advantage for the present application. In some embodiments, the monomers are organic compounds. In some embodiments, the monomers include silanes. In some embodiments, the solvent is a common photoresist solvent. Common photoresist solvents include ethyl lactate (EL), propylene glycol monomethyl ether acetate (PGMEA), ethyl 3-ethoxy propionate (EEP), and 2-heptanone (MAK). These solvents have desirable properties such low evaporation rates.

In some embodiment, polymer 209 is formed in direct contact with layers 207. Photoresist manufacturers generally recommend forming an adhesive layer before applying the photoresist. It has been found, however, that the polymer 209 is less likely to peel during CMP when the adhesive layer is omitted.

Figure 40:
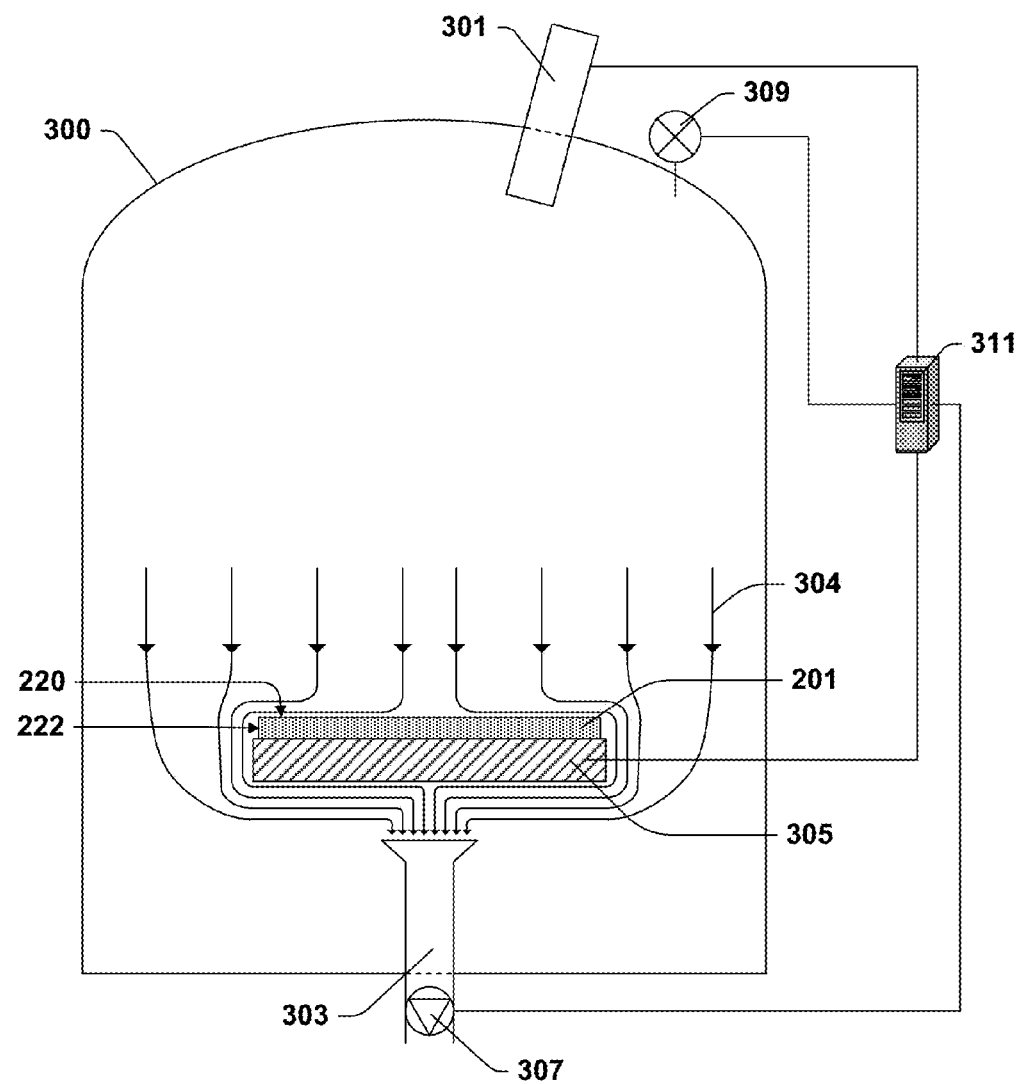
FIG. 40 illustrates a baking chamber in accordance with some embodiments of the present disclosure.

Processing 110 continues with act 113, which is pre-baking. FIG. 40 provides an example of a chamber 300 in which pre-baking 113 can be carried out. In some embodiments, pre-baking 113 includes placing substrate 201 on a hot plate 305 and heating substrate 201 with hot plate 305 as shown in FIG. 40. Pre-baking takes place within a first temperature range. In some embodiments, the first temperature range is a range within the range from 20° C. to 200° C. In some embodiments, temperatures within the first temperature range are below the boiling point of the solvent in monomer-containing solvent solution 209. In some embodiments, temperatures within the first temperature range are below the temperature at which polymer formed from monomer-containing solvent solution 209 begins to undergo cross-linking at a significant rate. In some embodiments, the temperature at which the polymer formed from monomer-containing solvent solution 209 begins to undergo cross-linking is about 150° C.

Pre-baking 113 continues at least until half the solvent in monomer-containing solvent solution 209 has evaporated. In some embodiments, pre-baking 113 continues at least until 90% of the solvent in monomer-containing solvent solution 209 has evaporated. In some embodiments, pre-baking 113 takes place over a period between 15 seconds and two minutes.

In some embodiments, a flow of gas 304 through chamber 300 is maintained during pre-baking 113. In some embodiments, gas 304 is one of nitrogen and air. Gas 304 enters chamber 300 through inlet port 301 and exits chamber 300 through exhaust port 303. Gas 304 can be functional as a carrier gas that facilitates the rapid and uniform evaporation of solvent from the upper surface 220 of substrate 201.

In some embodiments, the flow rate of gas 304 during pre-baking 113 is in the range from 5 to 1000 ml/min. In some embodiments, the pressure within chamber 300 during pre-baking 113 is in the range from 0.1 to 1.5 atm. In some embodiments, exhaust port 303 is coupled to a vacuum pump. In some embodiments, exhaust port 303 is equipped with a fan. In some embodiments, exhaust port 303 include a check valve.

In some embodiments, pressure within chamber 300 is measured by a gauge 309 and controlled by a controller 311. In some embodiments, controller 311 controls the flow rate of gas 304 through chamber 300. In some embodiments, controller 311 controls the heating of substrate 201 through hot plate 305. In some embodiments, controller 311 controls pressure within chamber 300 by varying the rate of a vacuum pump or fan coupled to exhaust port 303.

In some embodiments, the flow of gas 304 in a portion of chamber 300 above substrate 201 is substantially downward and perpendicular to an upper surface 220 of substrate 201. In some embodiments, the flow of gas 304 is substantially uniform around the perimeter 220 of substrate 201. This flow pattern facilitates uniform evaporation of solvent from monomer-containing solvent solution 209. In some embodiments, exhaust port 303 is positioned beneath hot plate 305 to facilitate forming this desired flow pattern. In some embodiments, exhaust port 303 is centered beneath hot plate 305 and substrate 201.

Processing 110 continues with act 114, which is baking. Baking 114 can also be carried out in chamber 300 by further increasing the temperature of substrate 201 after pre-baking 113 is complete. Over the course of pre-baking 113 and baking 114, monomer-containing solvent solution 209 polymerizes to form polymer 209. In some embodiments, polymer 209 fills at least 98% of the space in gaps 208. In some embodiments, polymer 209 is formed to a thickness in the range from 300 to 5000 Å.

During baking 114, polymer 209 becomes extensively cross-linked. Baking 114 takes place within a second temperature range, which is a range of temperatures above the first temperature range. In some embodiments, the second temperature range is a range within the range from 150° C. to 350° C. In some embodiments, the second temperature range is at least 50° C. above the first temperature range. In some embodiments, temperatures within the second temperature range are above the boiling point of the solvent in monomer-containing solvent solution 209. In some embodiments, temperatures within the second temperature range are at or above the temperature at which polymer 209 begins to undergo cross-linking at a significant rate.

Pre-baking 113 prior to baking 114 and maintaining a flow of gas 304 through chamber 300 during pre-baking improves the extent to which cross-linking in polymer 209 is uniform across surface 220 and with respect to depth within polymer 209. This uniformity contributes to uniformity in CMP and etch rates during subsequent processing with polymer 209. In some embodiments, a flow of gas 304 through chamber 300 is also maintained during baking 114. The flow of gas 304 through chamber 300 during baking 114 can be the same as the flow of gas 304 through chamber 300 during pre-baking 113 and has corresponding embodiments. In some embodiments, baking 114 takes place over a period between 15 seconds and five minutes.

Figure 4:
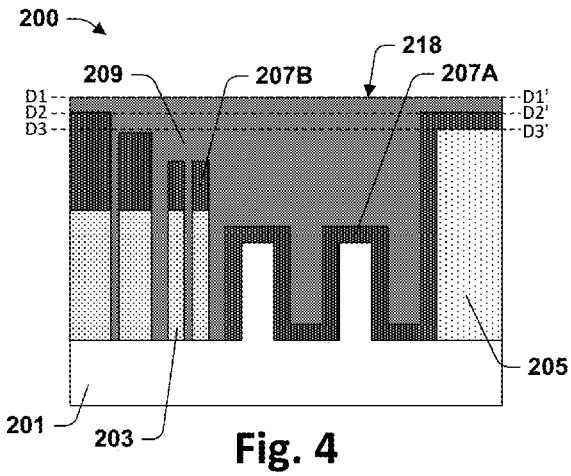

Processing 110 continues with act 115, CMP. In some embodiments, CMP 115 reduces the thickness of polymer 209 by from 200 to 2000 Å. In some embodiments, CMP 115 stops in the plane D1-D1', which is within polymer 209 and above layers 207 as shown in FIG. 4. In some embodiments, CMP 115 stops in the plane D2-D2' corresponding to the top of a layer 207 of a material to be recessed. In some embodiments, CMP 115 stops the plane D3-D3' corresponding to a layer 205 within which process 100 recesses layers 207. In some embodiments, CMP 115 stops on a film having a thickness in the range from 5 Å to 300 Å.

CMP 115 provides device 200 with a highly planar upper surface 218. As such, it is generally desirable to lower the surface 218 by CMP 115 until a practical limit is effectively reached. In some embodiment, that limit is avoiding damage to a layer 205 past which layers 207 are to be recessed. In some embodiments, that limit is avoiding damage to an underlying layer 203.

In some embodiments, CMP 115 provides a high selectivity between polymer 209 and a layer 207 that is being recessed. A high selectivity is in the range from 10:1 to 5000:1. High selectivity for polymer 209 in CMP 115 facilitates forming a highly planar surface 218.

In some embodiments, CMP 115 uses a slurry of metal oxide particles. In some embodiments, the slurry is a colloid. A colloid contains very small particles. Very small particles have a high surface to volume ratio, which facilitates chemical reaction. In some embodiments, the metal oxide is one of $SiO_2$, $Al_2O_3$, and $CeO_2$. In some embodiments, the metal oxide particles react with hydroxyl groups in polymer 209 in a dehydration reaction and become bound to polymer 209 through ether linkages. Reacting and bonding in this manner increases the selectivity of CMP 115 for removing polymer 209 and increases the polishing rate.

In some embodiments, CMP 115 uses a table rotation speed in the range from 30 to 110 rpm. In some embodiments, CMP 115 uses a downward force in the range from 0.5 to 5 psi. In some embodiments, CMP 115 uses a slurry flow rate in the range from 50 to 500 ml/min. These CMP conditions can facilitate forming a highly planar surface 218, maintaining the integrity of polymer 209 during CMP 115, and maintaining a high polishing rate.

Figure 5A:
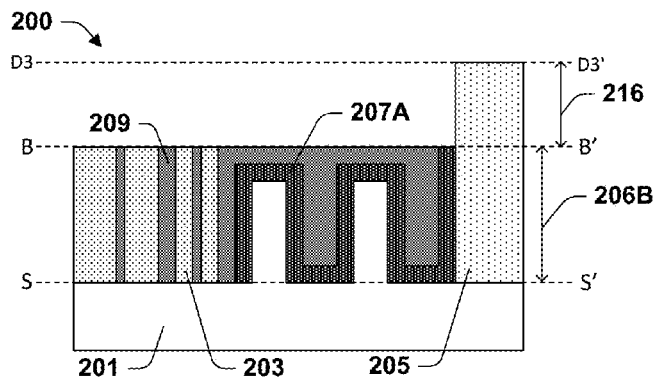
Figure 5B:
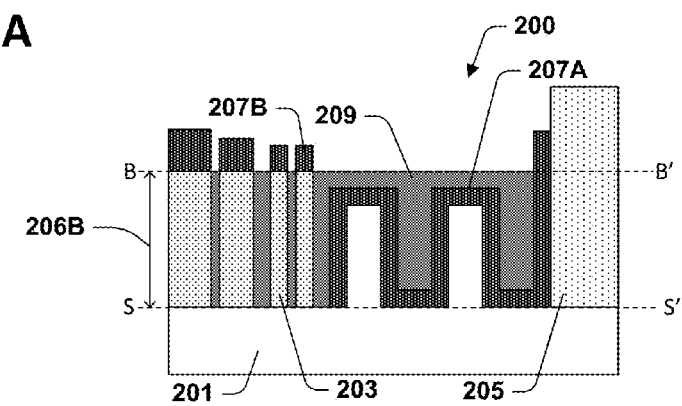

Processing 110 continues with act 117, etching to recess polymer 209 to a target height 206B as shown in FIGS. 5A and 5B. In some embodiments, etching 117 has a low selectivity between polymer 209 and a layer 207. A low selectivity (polymer 209 versus layer 207) is in the range from 1:5 to 10:1. In some embodiments, etching 117 has a very low selectivity between polymer 209 and a layer 207. A very low selectivity is in the range from 1:2 to 2:1. In some embodiments, etching 117 recesses polymer 209 and layers 207 to approximately the same extent, which is most desirable, and produces a structure as shown in FIG. 5A. In some embodiments, etching 117 recesses polymer 209 more than layers 207 and produces a structure as shown in FIG. 5B.

In most embodiments, etching 117 is dry etching. In some embodiments, etching 117 is plasma etching with source gases that include $H_2$ and $N_2$. In some embodiments, the plasma etching is characterized in part by the absence of fluorine compounds from the source gases. In some embodiments, etching 117 uses a flow rate for the source gases that is in the range from 5 to 500 ml/min. In some embodiments, etching 117 is carried out at a pressure in the range from 1 to 100 mTorr. In some embodiments, etching 117 uses a plasma source at a power setting in the range from 200 to 5000 W. In some embodiments, etching 117 uses bias power up to 500 W. In some embodiments, etching 117 is carried out with substrate 201 at a temperature in the range from 10 to 60° C. Plasma etching using conditions within these parameters can provide a low selectivity etch that progresses at a suitably high rate.

In some embodiments, etching 117 reduces the thickness of polymer 209 by from 10 to 3000 Å. In some embodiments, target height 206B corresponds to the height of a layer 203 underlying one or more of the layers 207. In some embodiments, target height 206B corresponds to recessing layers 207 a distance 216 within layer 205. The combination of CMP 115 to provide a highly planar surface 218 followed by low selectivity etching 117 causes polymer 209 to be uniformly recessed to the plane B-B'. Portions of polymer 209 significantly above the plane B-B' are effectively removed. Portions of polymer 209 and other materials forming parts of device 200 that are significantly below the plane B-B' are left intact. In some embodiments, etching 117 also causes layers 207 to be uniformly recessed to a plane.

Processing 110 optionally continues with further processing to recess layers 107. These options are relevant when etching 117 produces less recessing of layer 207 the is desired and results in a structure as shown in FIG. 5B. Further processing is indicated by the two yes branches from decision 118, either of which may be selected. In some embodiments where additional removal is desired, process 110 continues with act 120. Act 120 is selective etching where the selectivity is for removing layers 107 over polymer 209 to produce a structure as shown in FIG. 5A. For etching 120, polymer 209 masks structures below the plane B-B'.

In some embodiments where additional removal is desired, process no continues by repeating acts 111 through 117. In these embodiments, with each repetition layer 207 becomes further recessed and more uniformly recessed. The resulting structure progresses from the form of FIG. 5B toward the form of FIG. 5A.

Figure 6:
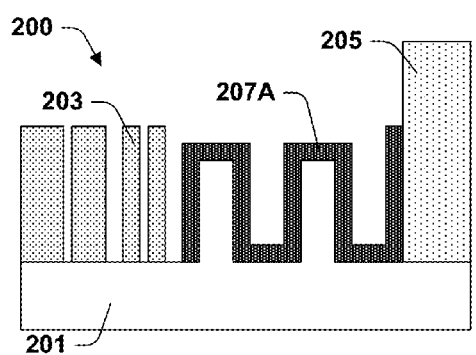

In some embodiments, processing no continues with act 119, removing polymer 209 to produces a structure as shown in FIG. 6. Act 119 is optional. In some embodiments, removal of polymer 209 is postponed. Polymer 209 can be removed by any suitable dry or wet etching process.

Polymer 209 can stabilize the surface of device 200 and exclude contaminants from gaps 208 during CMP 115 and etching 117. Polymer 209 can uniformly recess under etching 117 to form a mask having a planar upper surface for etching 120. Polymer 209 is a relatively hard material that facilitates maintaining a planar upper surface of device 200 during CMP 115.

In some embodiments, polymer 209 includes monomer units having hydroxyl groups. In some embodiments, polymer 209 includes monomer units that undergo hydration when exposed to water at a suitable pH. Unsaturated hydrocarbons are generally susceptible to hydration. In some embodiments, polymer 209 includes monomer units that have alkenes, alkynes, or aromatic groups. In some embodiments, polymer 209 includes ester, acrylate, or isocyanate monomers. In some embodiments, polymer 209 is an acrylate polymer or copolymer. In some embodiments, polymer 209 includes an aromatic monomer. In some embodiments, polymer 209 is a styrene polymer or copolymer. A polymer 209 having hydroxyl groups, or capable of acquiring hydroxyl groups through a hydration reaction, can react with oxide abrasive particles in a dehydration reaction that binds polymer 209 to the abrasive particles through ether linkages during CMP 115.

Figure 7:
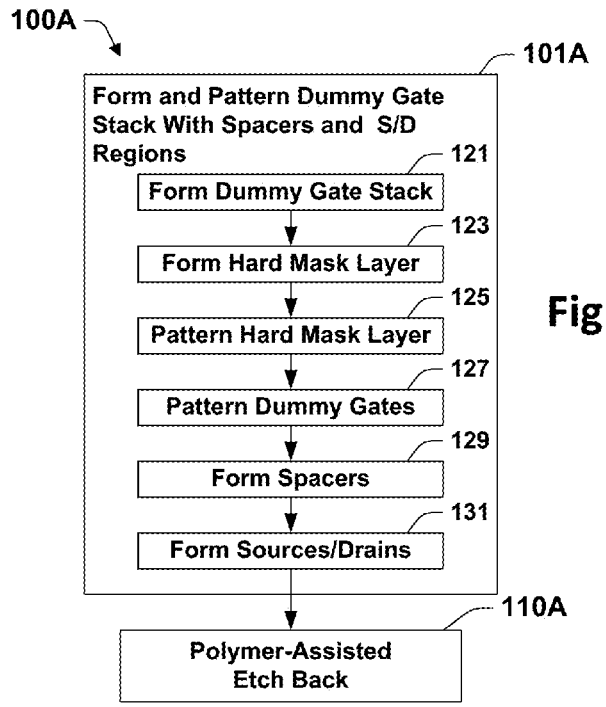
FIG. 7 is a Flow Chart of an Integrated Circuit Device Manufacturing Process in accordance with some embodiments.

In some embodiments, process 100 is a hard mask removal process. In some embodiments, the hard mask removal processes removes a hard mask used to pattern gates from a dummy gate stack. FIG. 7 provides an example, which is a process 100A in accordance with some embodiments of the present disclosure. FIGS. 8-13 illustrate an example integrated circuit device 200A undergoing process 100A. Process 100A includes a series of acts 101A that form a topographically variable hard mask 219 and a series of acts 110A, which is an embodiment of the previously described polymer-assisted etch back 110.

Figure 8:
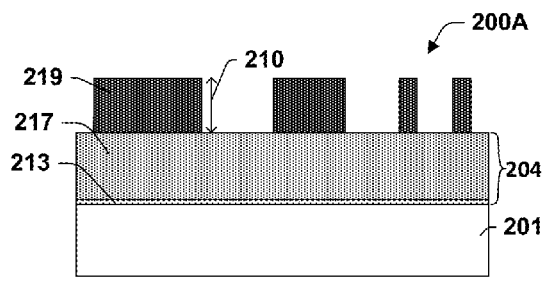
FIGS. 8-13 illustrate a partially manufactured integrated circuit device undergoing processing in accordance with some embodiments of the process illustrated by FIG. 7.

The series of acts 101A includes act 121, forming a dummy gate stack 204 over a substrate 201, act 123 forming a hard mask 219 over dummy gate stack 204, and act 125, patterning hard mask 219 to provide a structure as shown in FIG. 8. Although FIGS. 8-13 show process 100A being used to form dummy gates for conventional transistors, in some embodiments process 100A is used to form dummy gates for finFETs. As shown in FIG. 8, dummy gate stack 204 includes a layer 217 of sacrificial material. In some embodiments, the sacrificial material is polysilicon. In some embodiments, dummy gate stack 204 includes a high-k dielectric layer 213. In some embodiments, hard mask 219 is formed with a thickness in the range from 500 to 9000 Å. In some embodiments, hard mask 219 is one of $SiO_2$, SiN, SiC, SiCN, SiON, SiOCN, or a combination thereof. In some of these embodiments, hard mask 219 is one of $SiO_2$, SiN, and SiCN, which are particularly useful as hard mask materials.

Figure 9:
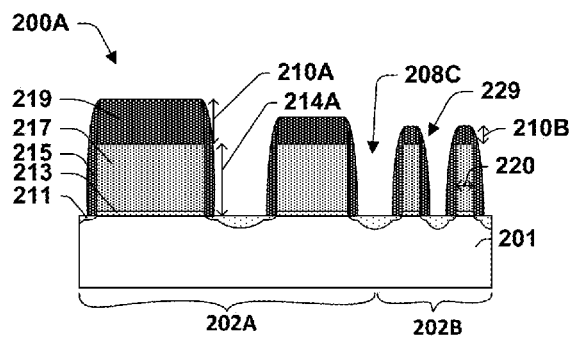

The series of acts 101A continues with act 127, patterning dummy gate stack 204 to form dummy gates 229, act 129, forming spacers 215, and act 131, forming source/drain regions 211 as shown in FIG. 9. In some embodiments, source/drain regions 211 are formed by ion implantation. In some embodiments, source/drain regions 211 are raised source/drain regions formed by epitaxy.

As shown in FIG. 9, acts 127 through 131 reduce the thickness 210 of hard mask 219. In some embodiments, acts 127 through 131 thin hard mask 219 until its maximum thickness 210A is in the range from 50 to 2000 Å less than its initial thickness 210. Acts 127 through 131 also cause thickness 210 of hard mask 210 to vary across substrate 201 between a maximum thickness 210A and a minimum thickness 210B. These variations stem from variations in the channel lengths 220 of dummy gates 229 and from variation in the pattern density of dummy gates 229 across substrate 201. Hard mask 219 is thinner in regions 202B as compared to regions 202A because the mean channel length 220 is shorter in regions 202A and because the fraction of substrate 201's area that is covered by hard mask 219 is lower in region 202B. In some embodiments, processing 101A causes hard mask 219 to have a variation in the range from 50 to 2000 Å between its maximum thickness 210A and its minimum thickness 210B.

Figure 10:
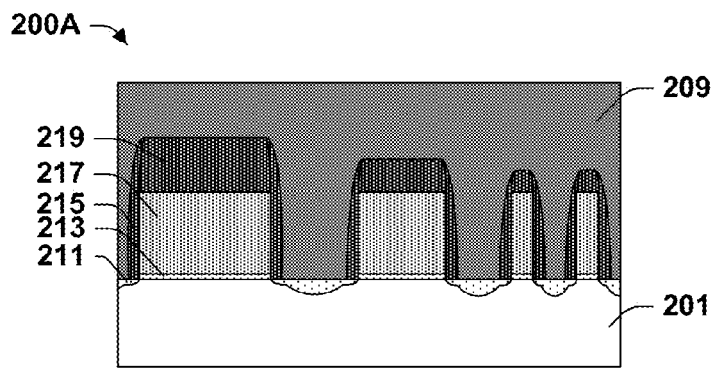

Process 100A continues with a series of acts 110A, which are an embodiment of polymer-assisted etch back 110 including at least acts 111-117 shown in FIG. 1. In processing 110A, acts 111-114 forms polymer 209 as shown in FIG. 10. In some embodiments of processing 110A, the thickness of polymer 209 is in the range from 500 to 5000 Å.

Figure 11:
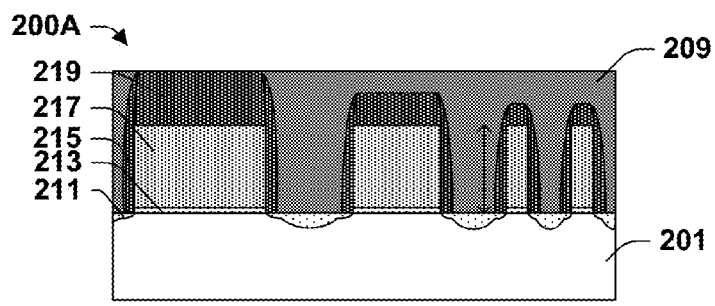

In processing 110A, CMP 115 reduces the height of polymer 209 as shown in FIG. 11. In some embodiments of processing 110A, CMP 115 lowers the height of polymer 209 by from 500 to 2000 Å. In some embodiments of processing 110A, CMP 115 stops on hard mask 219 as shown in FIG. 11. In some other embodiments of processing 110A, CMP 115 stops in polymer 209 just above the height of hard mask 219.

Figure 12:
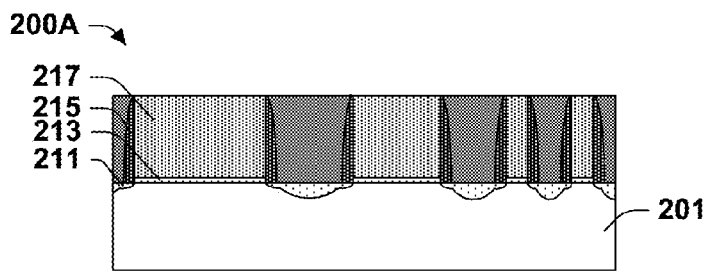
Figure 13:
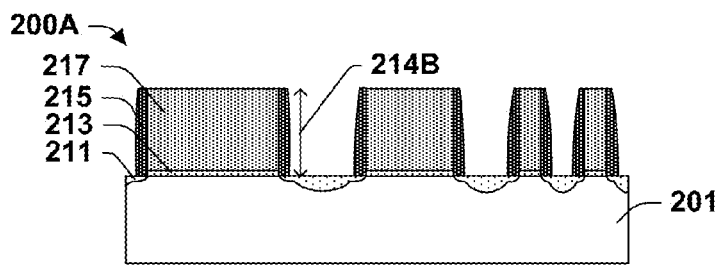

In processing 110A, etching 117 further reduces the height of polymer 209. In some embodiments, etching 117 removes hard mask 219 from sacrificial layer 217 as shown in FIG. 12. In some embodiments, hard mask 219 is removed from sacrificial layer 217 by further processing as indicated by decision 118 in FIG. 1. In some embodiments of processing 110A, etching 117 reduces the height of polymer 209 by from 50 to 3000 Å. In some embodiments of processing 110A, etching 117 takes places with substrate 201 at a temperature in the range from 20 to 40° C. In some embodiments of processing 110A, etching 117 is characterized in part by the absence of $CF_4$ from plasma source gases. Plasma etching with $CF_4$ can damage polysilicon, which can be the material used for sacrificial layer 217.

Processing 110A removes hard mask 219 while preserving the height 214 of dummy gates 229. In some embodiments, the height 214B of dummy gates 229 after processing 110A is at least 90% the height 214A of dummy gates 229 before processing 110A. In some embodiments, the height 214B of dummy gates 229 varies by 10% or less among dummy gates 229 after processing 110A.

Figure 14:
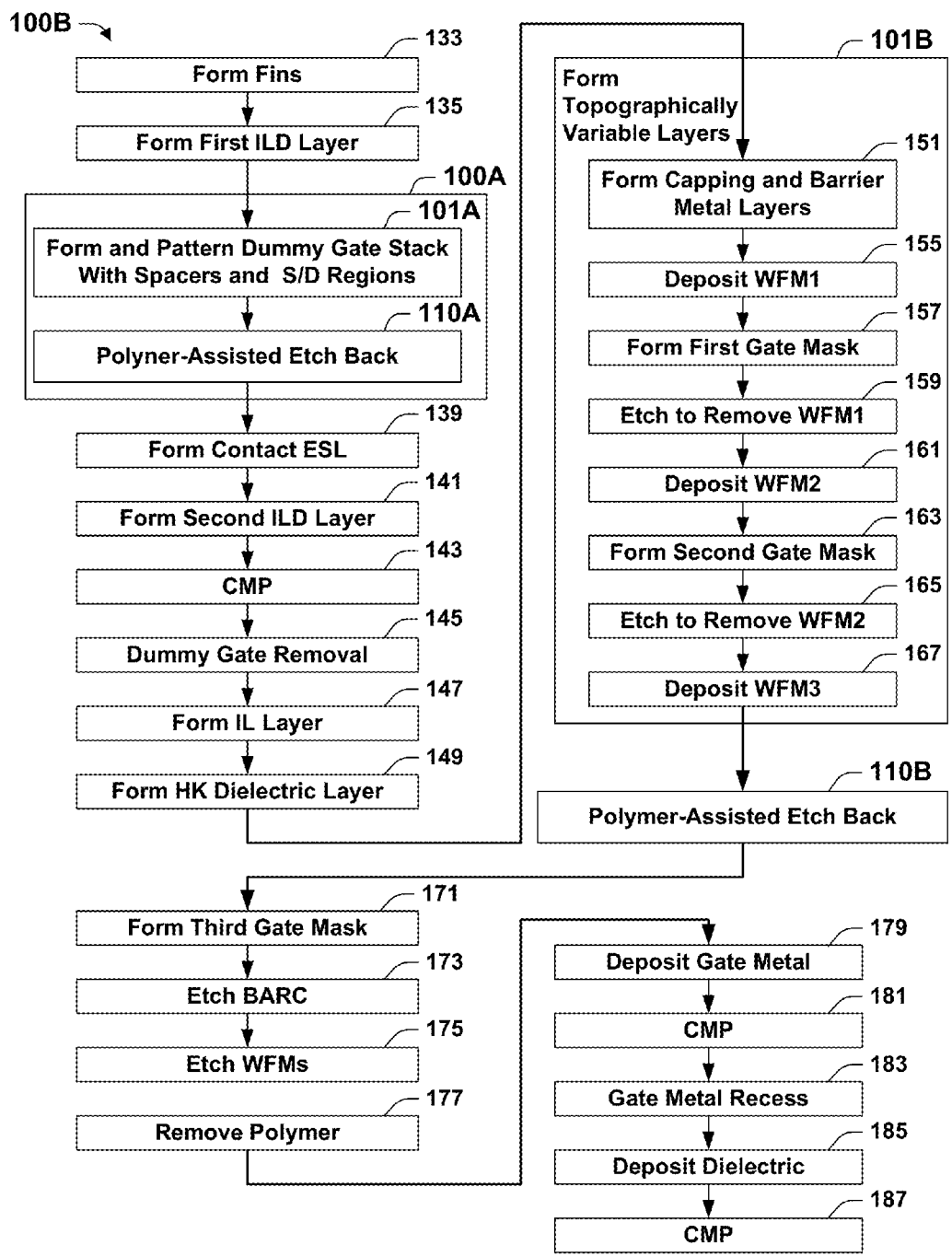
FIG. 14 is a flow chart of an integrated circuit device manufacturing process in accordance with some embodiments.
Figure 15:
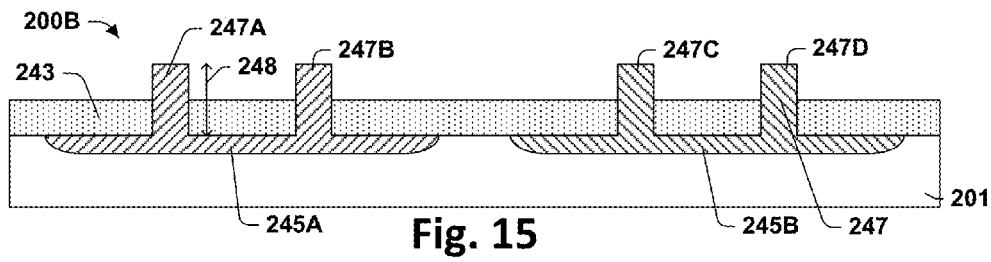
FIGS. 15-39 illustrate a partially manufactured integrated circuit device undergoing processing in accordance with some embodiments of the process illustrated by FIG. 14.

In some embodiments, process 100 is a replacement gate process. FIG. 14 provides an example of a replacement gate process 100B in accordance with some embodiments of the present disclosure. FIGS. 15-39 illustrate an example IC device 200B undergoing process 100B. In some embodiments, IC device 100B includes tri-gate or gate-all-around finFETs. Process 100B begins with act 133, forming fins 247 on a semiconductor substrate 201 and act 135, forming a first inter-level dielectric (ILD) layer 243 as shown in FIG. 15. Semiconductor substrate 201 can be any suitable type of substrate. In some embodiments, substrate 201 is a semiconductor wafer. In some embodiments, substrate 201 is semiconductor-on-insulator.

Fins 247 include n-channel fins 247A and 247B and p-channel fins 247C and 247D. FIG. 15 illustrates n-channel fins 247A and 247B formed in a p-well 245A and p-channel fins 247C and 247D formed in an n-well 245B, however, fins 247 can be formed and doped in any suitable manner. In some embodiments, fins 247 are etched from substrate 201. In some embodiments, fins 247 are replacement fins produced by epitaxial growth. In some embodiments, fins 247 are etched from doped substrate 201. In some embodiments, fins 247 are grown with dopants. In some embodiments, fins 247 are doped after their formation. In some embodiments, fins 247 have a height in the range from 100 to 1000 Å.

ILD layer 243 can be formed by any suitable process. In some embodiments, ILD layer 243 is formed by depositing dielectric over fins 247, chemical mechanical polishing to the height of fins 247, then etching to recess ILD layer 243 as shown in FIG. 15. In a replacement fin process, ILD layer 243 can form a matrix in which fins 247 are grown, after which ILD layer 243 is recessed. ILD layer 243 can be formed of any suitable dielectric or combination of dielectrics. Examples of dielectrics that can be suitable include SiO2, silicate glasses, and low-k dielectrics.

Figure 16:
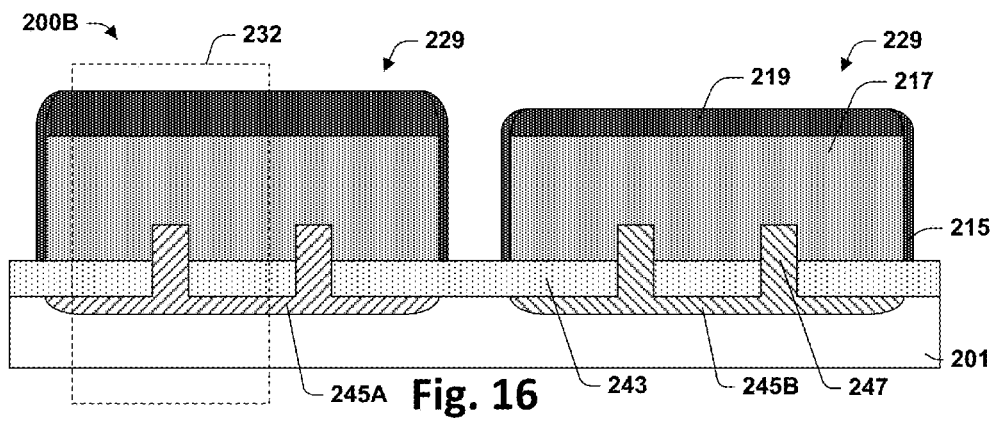
Figure 16A:
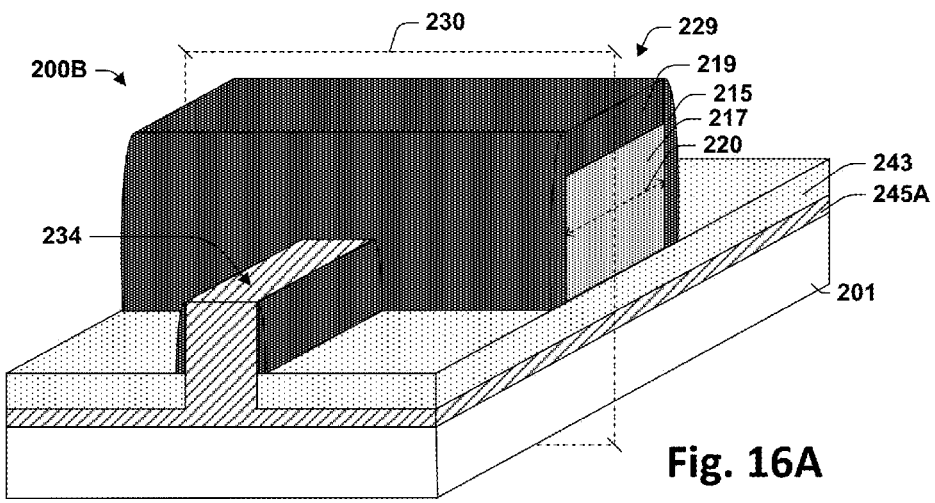

Process 100B continues with a series of acts 100A by which dummy gates 229, spacers 215, and source/drain regions 211 are formed. In some embodiments, these acts are an embodiment of process 100A of FIG. 7. FIGS. 16 and 16A show an intermediate stage of this process following the formation of spacers 215.

Figure 17:
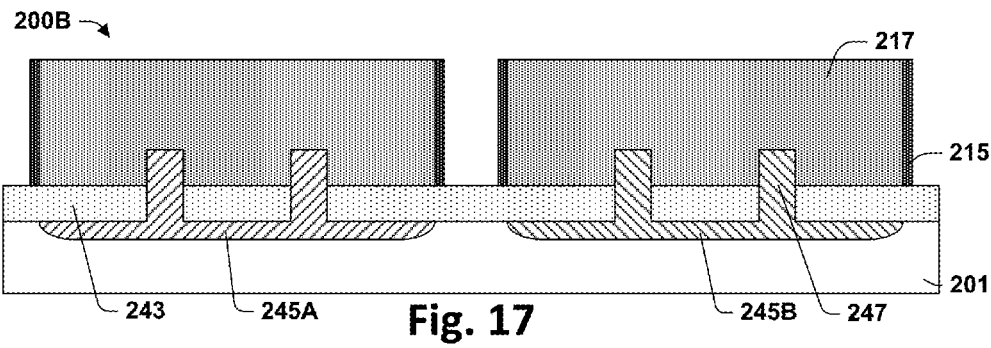

FIG. 16A provides a perspective view of portion 232 of FIG. 16. With the exception of FIG. 16A, FIGS. 15-39 are cross-sectional views along a plane 230, which is shown in FIG. 16A. Plane 230 runs perpendicular to fins 247, cuts fins 247 mid-channel, and runs along the lengths of dummy gates 229. Source/drain regions 211 are formed at locations 234, identified in FIG. 16A, which are outside these views. At the conclusion of acts 100A, hard mask 219 is removed as shown in FIG. 17.

Figure 18:
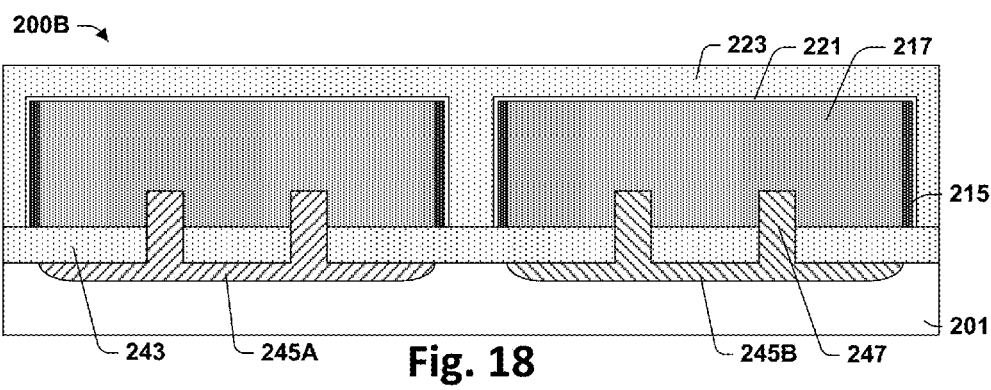
Figure 19:
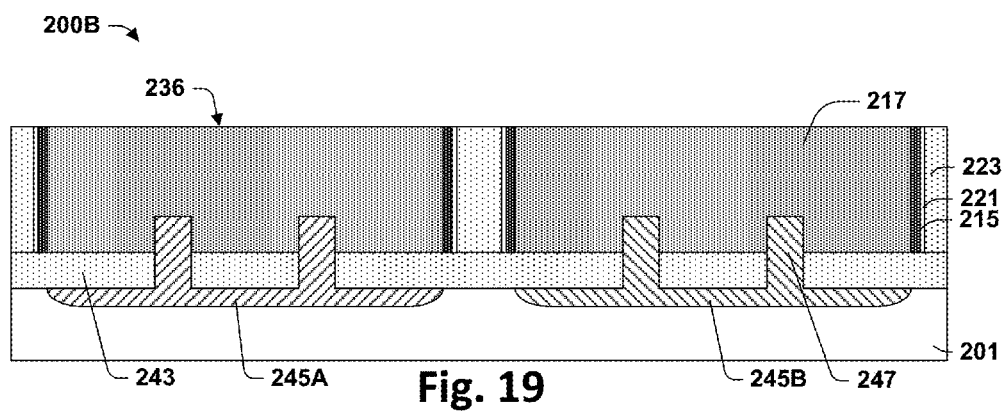
Figure 20:
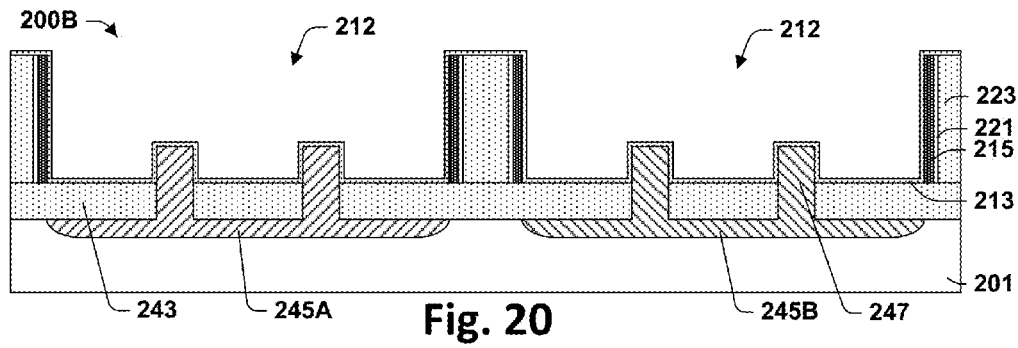

Process 100B continues with act 139, forming a contact etch stop layer (CESL) 221 and act 141, forming an additional inter-level dielectric layer 223 as shown in FIG. 18. In some embodiments, CESL 221 is SiN. Act 143 is chemical mechanical polishing to expose an upper surface 236 of dummy gates 229 as shown in FIG. 19. Process 100B continues with act 145, dummy gate removal to form trenches 212, act 147, forming an interfacial (IL) layer (not shown), and act 149, forming a high-k dielectric layer 213 as shown in FIG. 20. It should be appreciated that the IL layer and high-k dielectric layer 213 can be formed with dummy gate stack 204 or formed subsequently as in this example.

Process 100B continues with a series of acts 101B that form topographically variable metal layers, including work function metal layers 237 that are to be subsequently recessed within ILD layer 223. The individual and collective thicknesses of these metals will vary between standard voltage and low voltage transistors and between n-channel and p-channel transistors. In some embodiments, these variable thicknesses result from a plurality of deposition, masking, and etching operations as shown in this example. In some embodiments, p-channel work function metals 237 are deposited before n-channel work function metals 237 as shown in FIGS. 21-27. In some embodiments, n-channel work function metals 237 are deposited before p-channel work function metals 237. Some or all of these work function metals 237 can be recessed by polymer-assisted etch back 110B.

Figure 21:
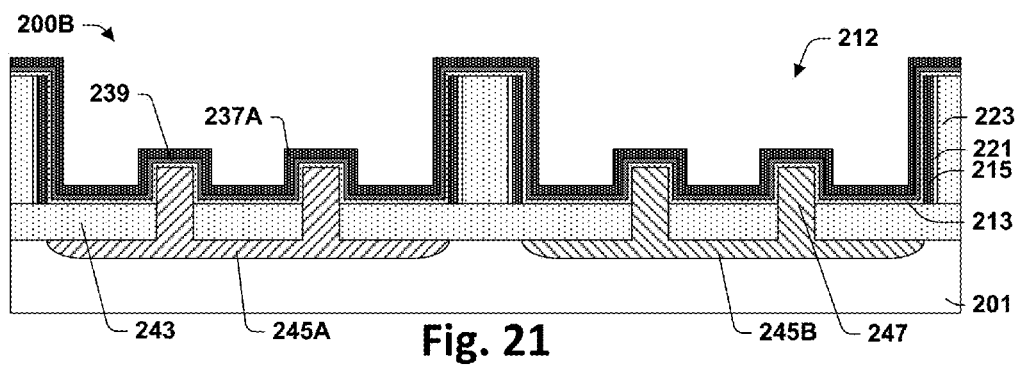

Process 101B begins with act 151, forming capping and barrier metal layers 239 and act 155, forming a first work function metal (WFM1) layer 237A as shown in FIG. 21. WFM1 layer 237A lines trenches 212 and rises to the tops and above trenches 212. In some embodiments capping and barrier metal layers 239 include a TiN capping layer. In some embodiments, capping and barrier metal layers 239 include a TaN barrier metal layer. Examples of work function metals include, without limitation, Ti, TiN, TiAl, W, TaN, WN, Re, Ir, Ru, and Mo. In some embodiments, a work function metal is one of Ti, TiN, TiAl, and TaN.

Figure 22:
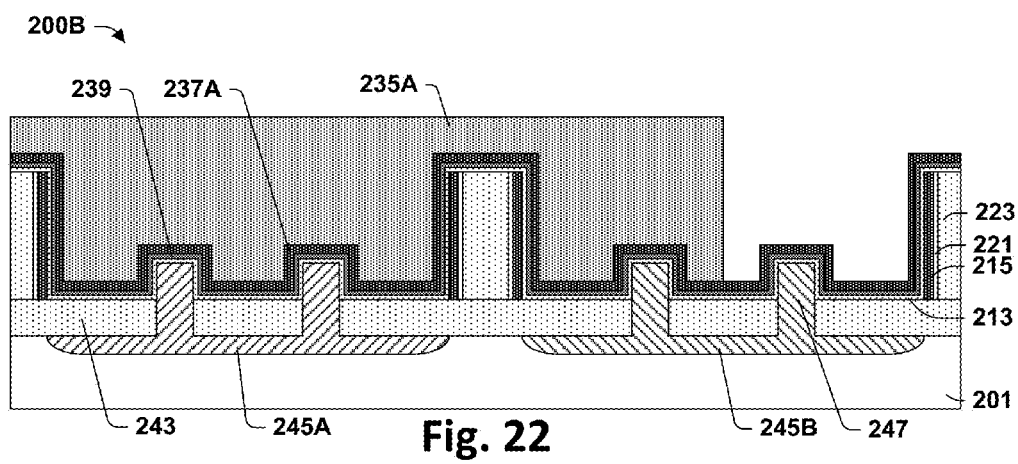
Figure 23:
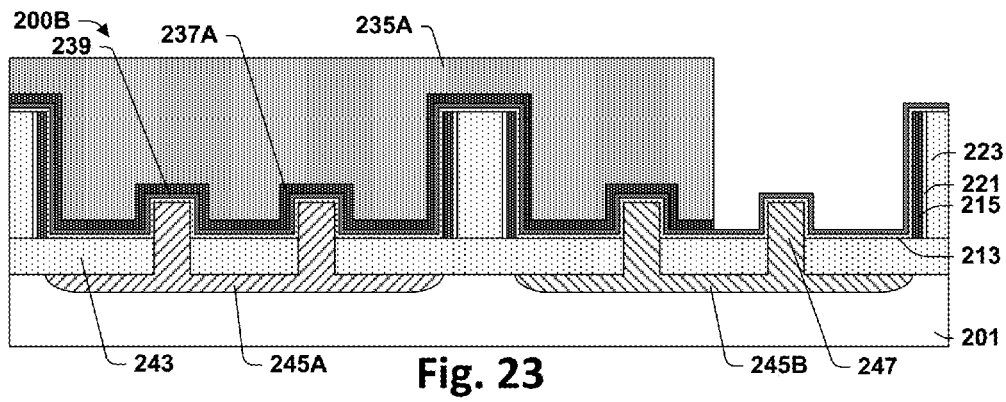

Process 101B continues with act 157, forming a first gate metal mask 235A as shown in FIG. 22. Mask 235A masks n-channel fins 247 and some of the p-channel fins 247. Act 159 is an etch process that removes WFM1 layer 237A from the exposed p-channel fins 247 as shown in FIG. 23. Mask 235A is then stripped.

Figure 24:
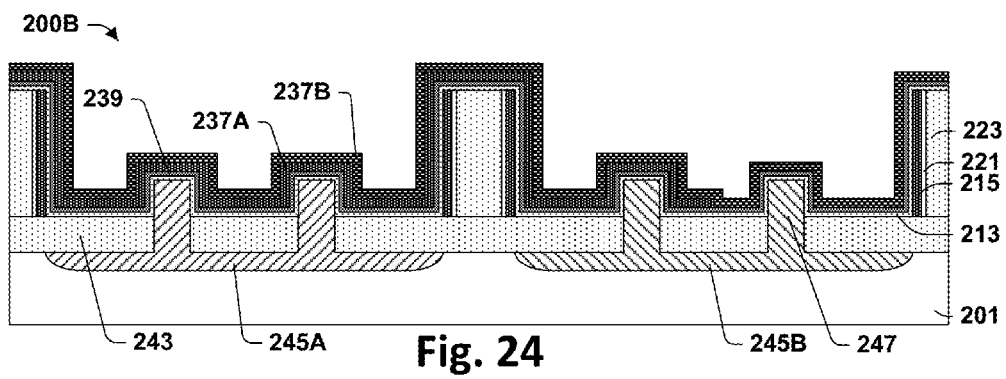
Figure 25:
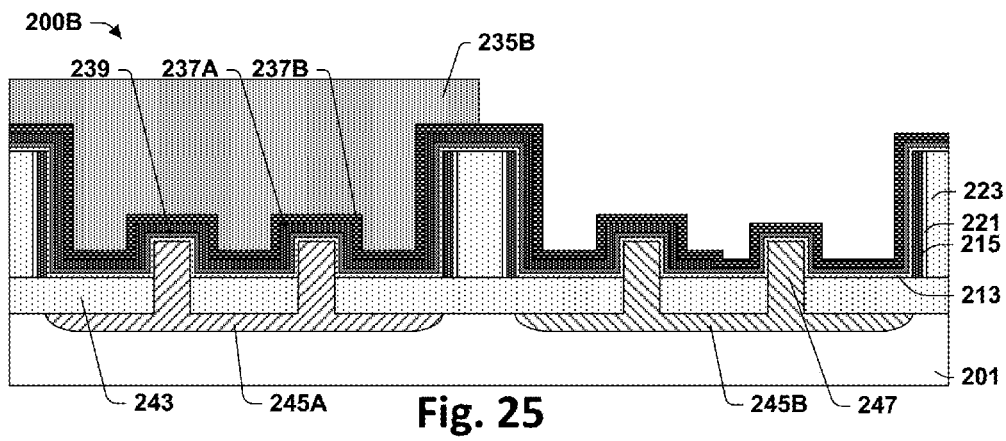
Figure 26:
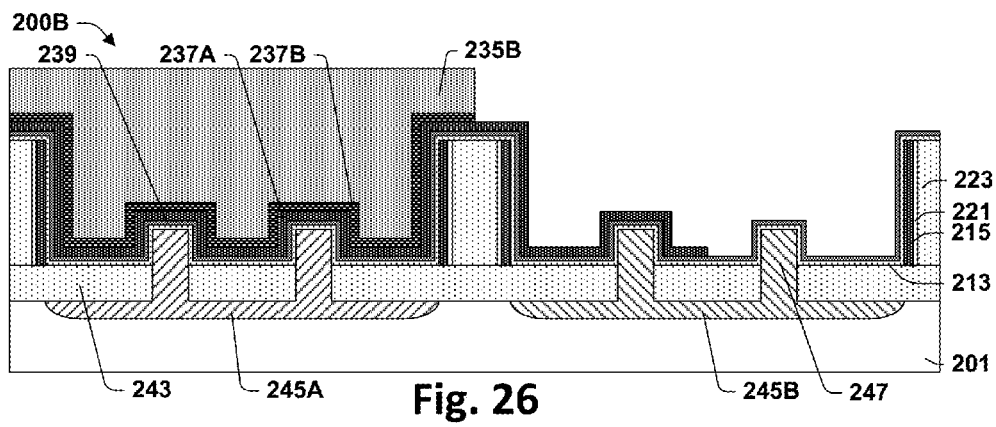
Figure 27:
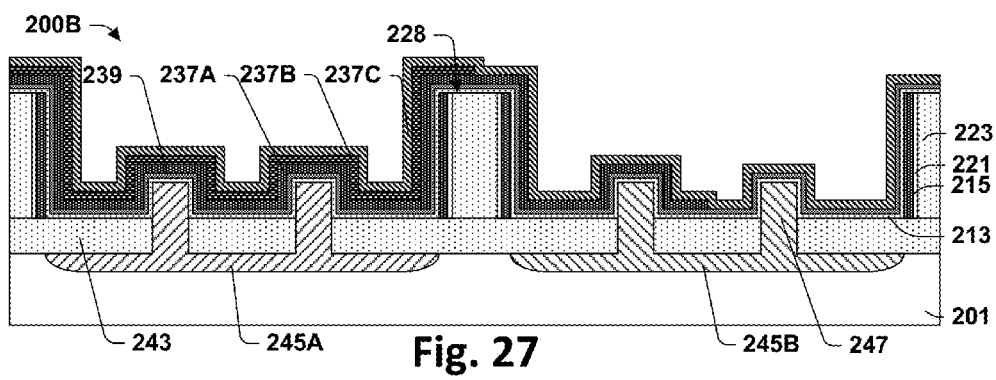

Process 101B continues with act 161, forming a second work function metal (WFM2) layer 237B as shown in FIG. 24. Act 163 then forms a second gate metal mask 235B that covers n-channel fins 247 as shown in FIG. 25. Act 165 is an etch process that removes WFM2 layer 237B from the p-channel fins 247 as shown in FIG. 26. Etch process 165 is a selective etch that removes exposed portions of WFM2 layer 237B while leaving at least some thickness of the exposed portions of WFM1 layer 237A intact. Mask 235B is then stripped. Process 101B continues with act 167, forming a third work function metal (WFM3) layer 237C as shown in FIG. 27.

To avoid current leaks, WFM layers 237 are to be removed from over ILD layer 223 and recessed from an upper surface 228 of ILD layer 223. The overall thickness of WFM layers 237 varies across substrate 201. In some embodiments, the difference between the minimum and the maximum thickness of WFM layers 237 is in the range from 100 to 500 Å. This variation in thickness and the variation in pattern density of WFM layers 237 across substrate 201 are challenges to performing a planar recessing process. In process 100B, those challenges are met by applying polymer-assisted etch back 110B, which is an embodiment of polymer-assisted etch back 110 of FIG. 1.

Figure 28:
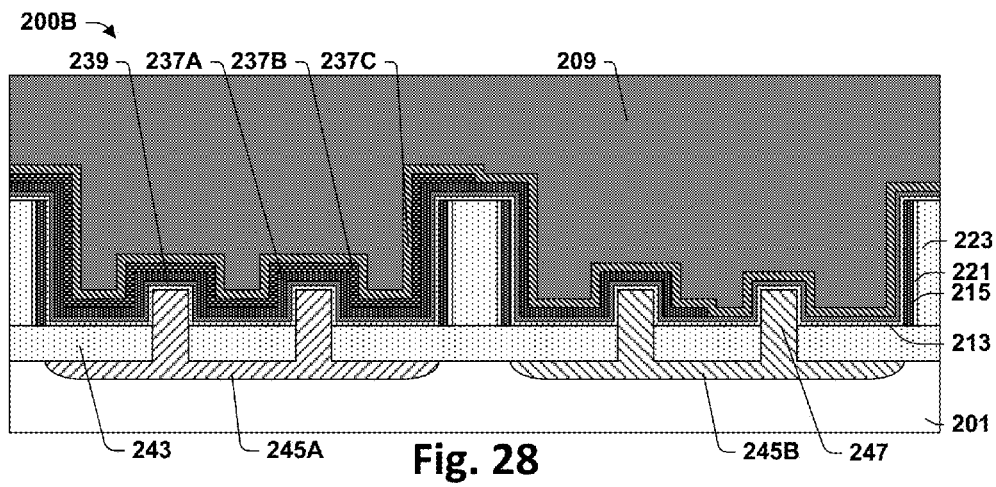

Processing 110B begins with acts 111-114, which form a coating of polymer 209 as shown in FIG. 28. In some embodiments of processing 110B, the coating thickness of polymer 209 is in the range from 300 to 3000 Å.

Figure 29:
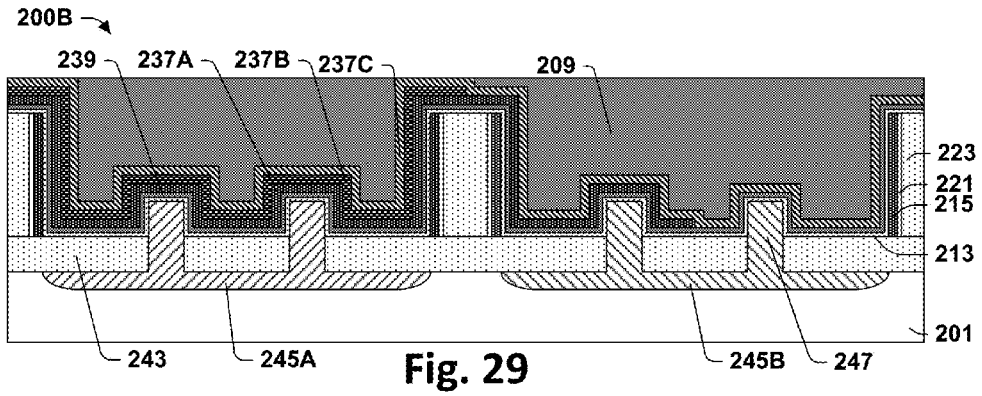

In processing 110B, act 115, CMP, reduces the height of polymer 209 as shown in FIG. 29. In some embodiments of processing 110B, CMP 115 lowers the height of polymer 209 by an amount in the range from 500 to 2000 Å. In some embodiments of processing 110B, CMP 115 stops on WFM layers 237 as shown in FIG. 29. In some embodiments of processing 110B, CMP 115 stops in polymer 209 just above the height of WFM layers 237. In some embodiments of processing 110B, CMP 115 stops on CESL 221 or spacers 215. In some embodiments of processing 110B, CMP 115 stops on ILD layer 223.

Figure 30:
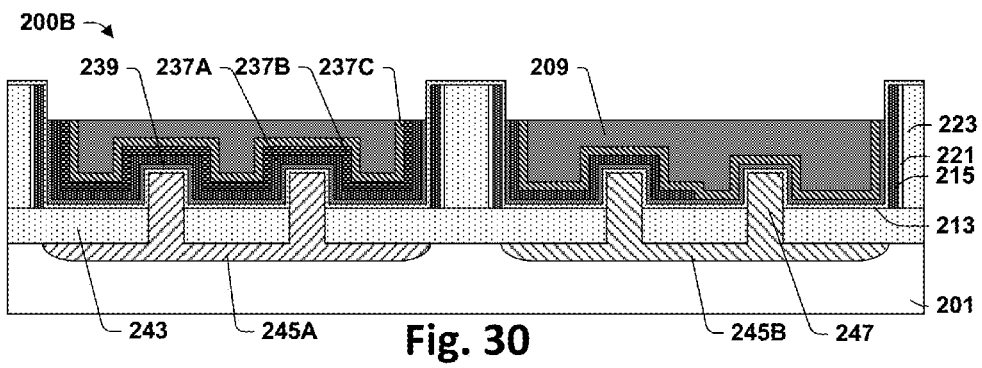

In processing 110B, act 117, etching back, further reduces the height of polymer 209 and recesses polymer 209 within ILD layer 223. In some embodiments, etching 117 also recesses one or more of WFM layers 237 as shown in FIG. 30. In some embodiments, etching 117 also recesses capping and barrier metal layers 239. In some embodiments of processing 110B, one or more of WFM layers 237 are recessed by further processing as indicated by decision 118 in FIG. 1. In some embodiments of processing 110B, etching 117 reduces the height of polymer 209 and WFM layers 237 by an amount in the range from 10 to 1000 Å. In some embodiments of processing 110B, etching 117 takes places with substrate 201 at a temperature in the range from 20 to 40° C. In some embodiments of processing 110B, etching 117 is characterized in part by the absence of $CF_4$ from plasma source gases. $CF_4$ present during plasma etching 117 can react with metals in WFM layers 237 to produce byproducts that act as an etch stop layer and interfere with recessing of WFM layers 237.

In some embodiments, polymer 209 is stripped at the conclusion of processing 110B. In some other embodiments, as shown by this example, polymer 209 is further used to assist in forming a mask for an additional work function metal etch.

In some alternative embodiments, this additional work function metal etch is carried out in a polymer-assisted etch back 110B that includes selective etch 120.

Figure 31:
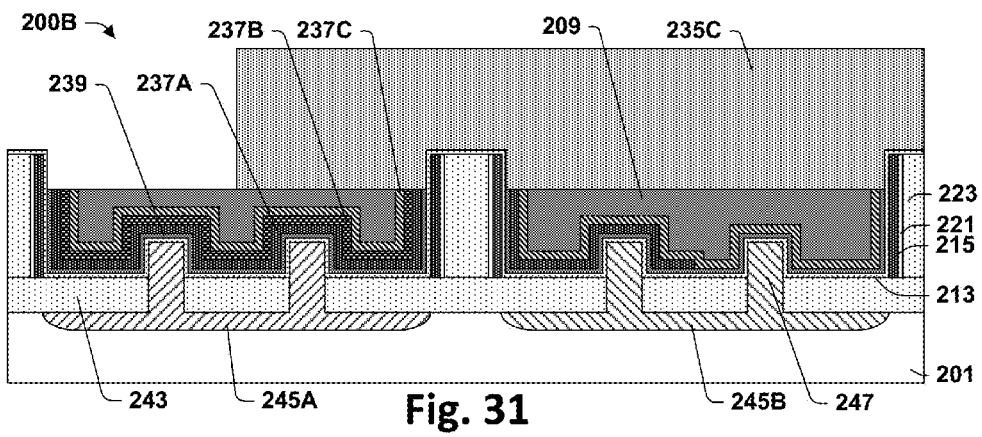
Figure 32:
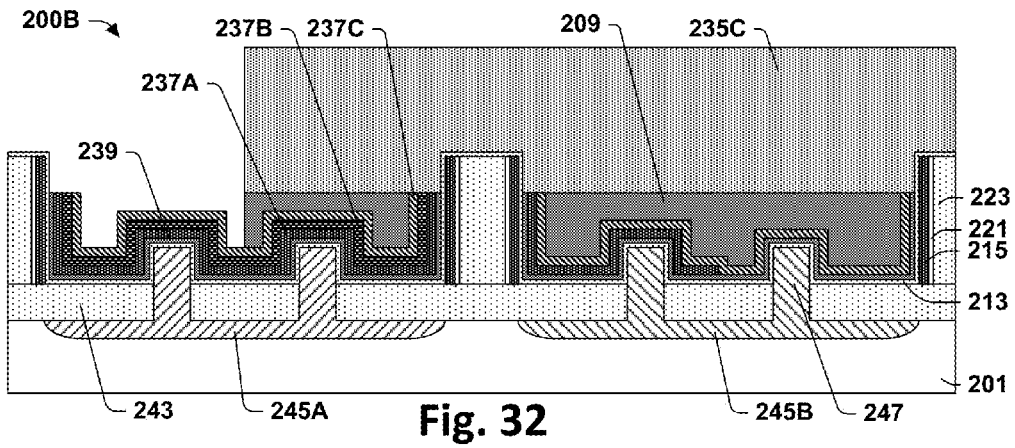
Figure 33:
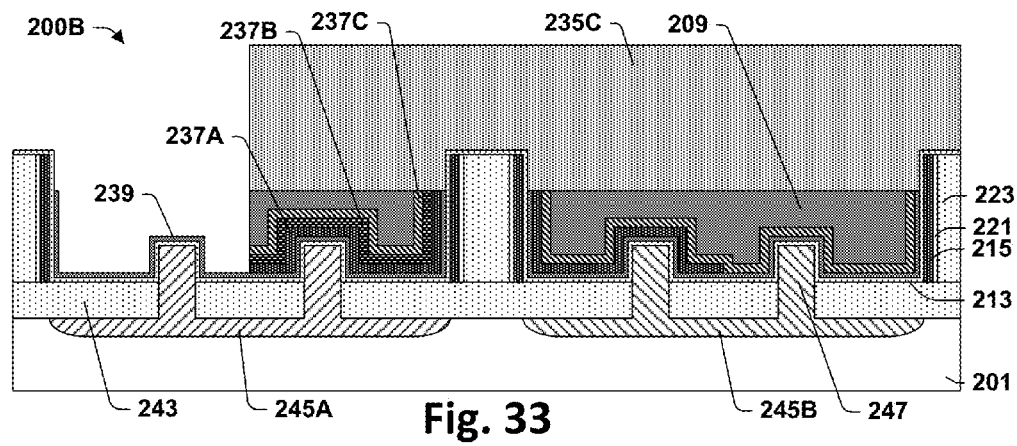

In FIG. 14, polymer-assisted etch back 110B is followed by act 171, which is forming a third gate mask 235C as shown in FIG. 31. Mask 235C masks p-channel fins 247 and some of the n-channel fins 247. Act 173 is an etch process that removes polymer 209 from the exposed n-channel fins 247 as shown in FIG. 32. In some embodiments, act 173 is followed immediately by act 175, which an etch process that removes WFM layers 237 from the exposed n-channel fins 247 as shown in FIG. 33.

Figure 32A:
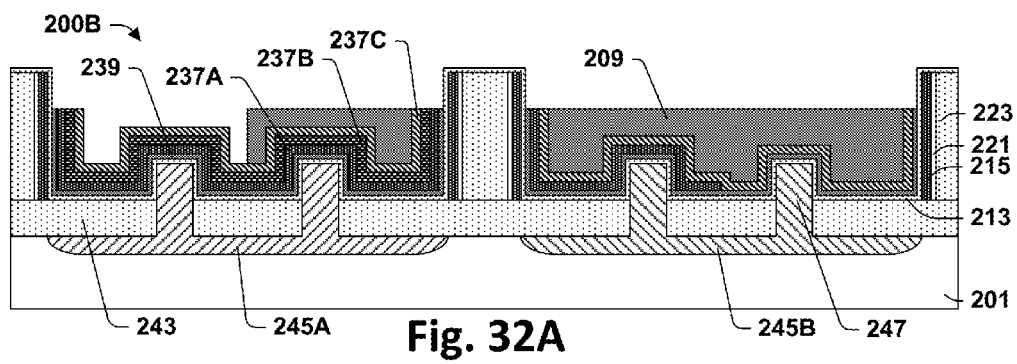

In some alternate embodiments, mask 235C is stripped before act 175 as shown in FIG. 32A. Moreover, acts 171 and 173 can occur after etching 117 within processing 110B. Then, act 175, the etch process that removes WFM layers 237 from the exposed n-channel fins 247, can also be a selective etch 120 that recesses WFM layers 237. In these embodiments, polymer 209 masks WFM layers 237 below the target removal height everywhere but locations where it is desirable to remove WFM layers 237 entirely. In these alternate embodiments, the etch 175 that removes WFM layers 237 from the exposed n-channel fins 247 is combined with an etch 120 that recesses WFM layers 237, thereby reducing the required number of etch operations. In other embodiments mask 235C is stripped after act 175.

Figure 34:
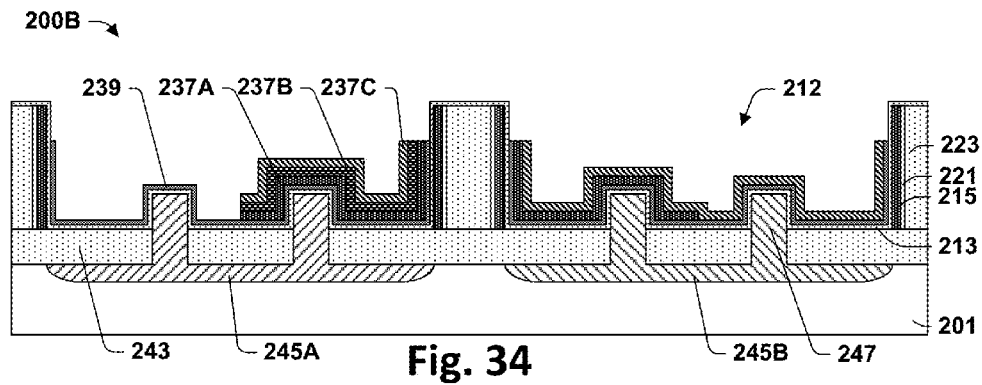
Figure 35:
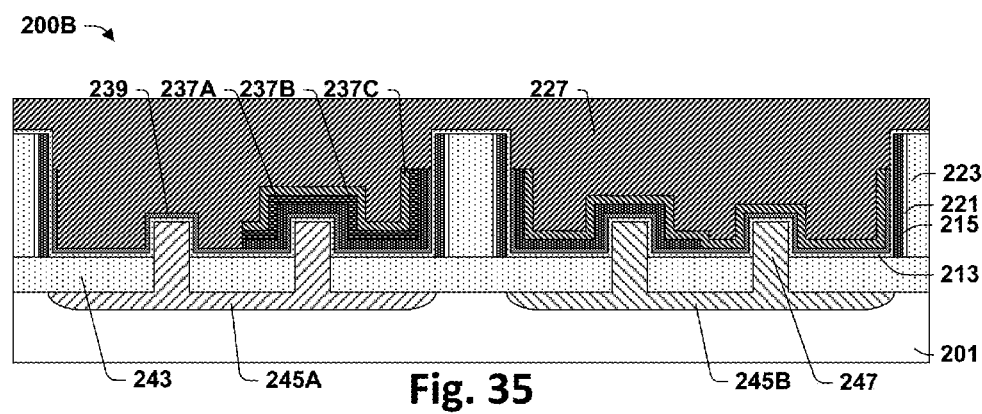
Figure 36:
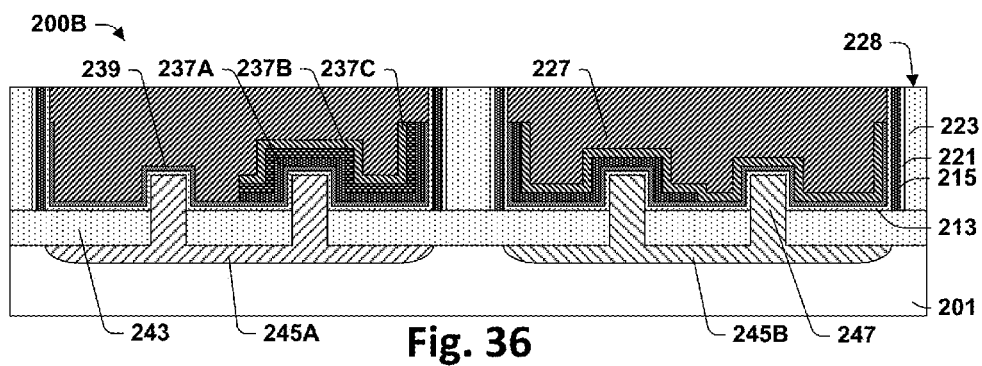
Figure 37:
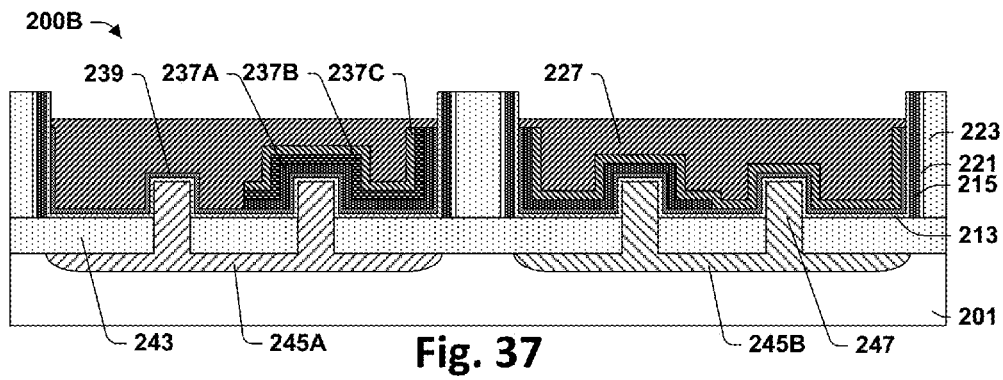
Figure 38:
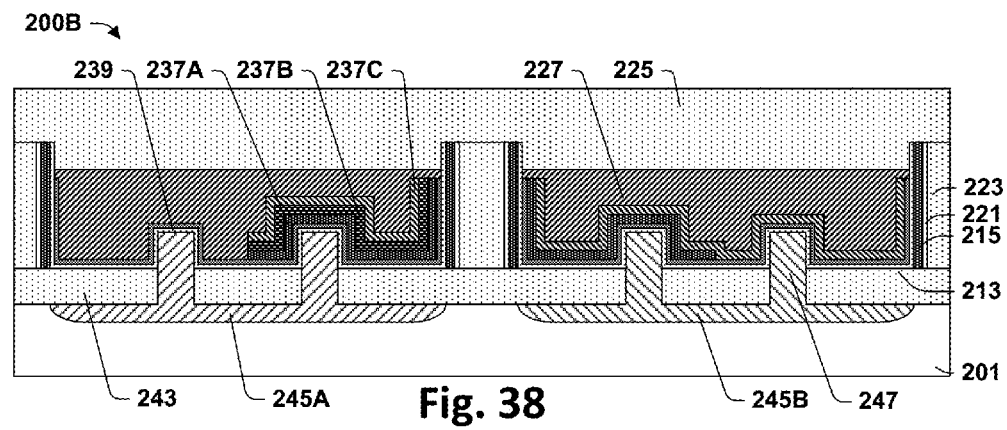

Process 100B continues with act 177, removing the remaining portion of polymer 209 to produce a structure as shown in FIG. 34, then act 179, depositing a metal 227 that fills trenches 212 as shown in FIG. 35. Metal 227 can be any suitable metal. Examples of metals that can be suitable include Al, W, Co, Cu, and Ni. Act 181 is a CMP process that lowers metal 227 to the height of ILD layer 223 as shown in FIG. 36. Act 183 is an etch process that recesses metal 227 within ILD layer 223 as shown in FIG. 37. In some embodiments, one or more of WFM metals 237 are recessed together with metal 227 in act 183. In some embodiments, capping and barrier metal layers 239 are recessed together with metal 227 in act 183. However, in some embodiments one or more of WFM metals 237 and capping and barrier metal layers 239 cannot be recessed effectively together with metal 227 in act 183. In these embodiments, at least the layers that cannot be recessed effectively together with metal 227 in act 183 are recessed by processing polymer-assisted etch back 110B.

Figure 39:
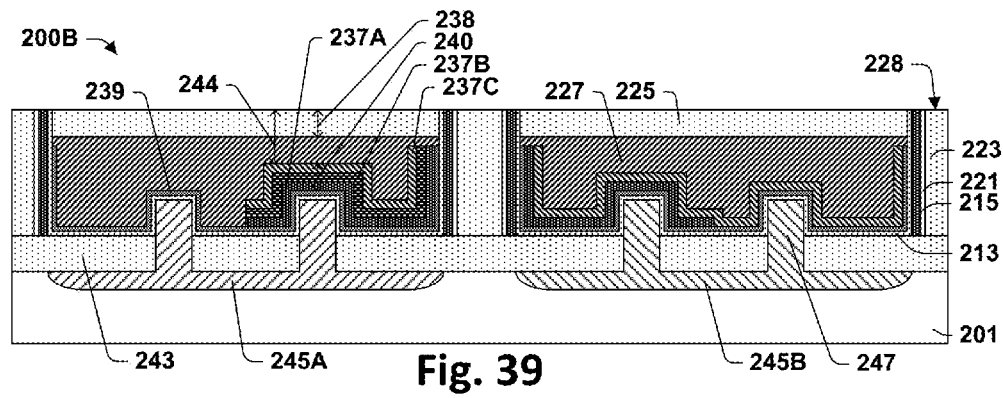

Process 100B continues with act 185 deposits a third ILD layer 225 as shown in FIG. 36. Act 187 is a CMP process that lowers ILD layer 225 to the same height as ILD layer 223 as shown in FIG. 39. As shown in FIG. 39, the thickness 238 of ILD layer 223 is generally determined by the extent to which metal 227 is recessed by etching 183. In some embodiments, thickness 238 is in the range from 10 to 1000 Å. In some embodiments, thickness 238 is in the range from 50% to 95% the height 244 of ILD layer 223 over WFM layers 237 where they lie mid-channel over fins 247. Making thickness 238 over half the height 244 provides a desirable amount of insulation, but the process window is relatively narrow.

In some embodiments, polymer-assisted etch back 110B recesses one or more WFM layers 237 to an equal or greater extent than etching 183 recesses metal 227. This results in WFM layers 237 being below the upper surface of metal 227. In most embodiments, polymer-assisted etch back 110B does not reduce the thickness 240 of any of WFM layers 237 where they lie mid-channel over fins 247. Polymer-assisted etch back 110B can recess WFM layers 237 to within the limits of these parameters.

The present disclosure provides a method of manufacturing an integrated circuit device that includes processing a wafer through a series of operations that form a topographically variable layer of a material on the wafer, spin coating a monomer-containing solvent solution over the material, heating the wafer to within a first temperature range, maintaining the wafer within the first temperature range while the majority of the solvent evaporates from the solution, heating the wafer to within a second temperature range that is above the first temperature range, then maintaining the wafer within the second temperature range until the monomers have polymerized to form a polymer coating and the polymers in the coating have cross-linked. CMP removes a first portion of the polymer. Etching removes a second portion of the polymer and effectuates a top-down recessing of the polymer. In some embodiments, the etching has a low selectivity between the polymer and the layer that varies in height. In some embodiments, the etching that removes a second portion of the polymer simultaneously reduces the height of the layer and effectuates a top-down recessing of the layer.

The methods provided by the present disclosure effectuate a planar recessing of a material layer that, at least initially, is variable in height. Any of the material layer above a certain height can be removed. Structures that are substantially below that certain height can be protected from contamination and left intact. The method can be particularly effective when an abrasive used during CMP forms ester linkages with the polymer. Uniform cross-linking within the polymer coating facilitates forming and maintaining a planar surface of the polymer through CMP and etch back. Uniform cross-linking is improved by the two-step baking process. Uniformity is further improved by providing a gas flow through the chamber in which baking takes place, with the gas flow entering the chamber above the wafer and exiting the chamber below the wafer.

The present disclosure also provides a method of manufacturing an integrated circuit device that includes forming a topographically variable layer of a material on a wafer. The layer varies in height across the wafer. A monomer-containing solvent solution is coated over the layer of the material. The wafer is heated on a hot plate in a chamber while the majority of the solvent evaporates from the solution, the monomers in the solution form polymers, and the polymers cross-link. While the majority of the solvent evaporates from the solution, a gas is flowed through the chamber. The gas flow enters the chamber above the wafer and exits the chamber below the wafer. A first portion of the polymer coating is removed by CMP. Etching is then used to effectuate a top-down recessing of the polymer coating. In some embodiments, wherein the heating of the wafer on the hot plate in the chamber includes heating the wafer to within a first temperature range, maintaining the wafer within the first temperature range while the majority of the solvent evaporates from the solution, heating the wafer to within a second temperature range that is above the first temperature range, and maintaining the wafer within the second temperature range until the monomers have polymerized to form a polymer coating and the polymers in the coating have cross-linked.

The present disclosure further provides a method of manufacturing an integrated circuit device the includes forming finFETs having dummy gates having a height and wrapping fins on a semiconductor substrate, forming a first dielectric layer that covers the semiconductor substrate and has a height at least equal to the height of the dummy gates, removing the dummy gates to form trenches that are within the first dielectric layer, forming a layer of a work function metal over a channel region of some of the fins, wherein the layer of the work function metal lines at least a portion of the length of at least some of the trenches, whereby the layer of the work function metal rises to the tops of the trenches at some locations, forming a polymer coating above the layer of the work function metal, wherein the polymer fills the trenches. Forming the polymer coating includes spin coating with a monomer-containing solvent solution, heating the semiconductor substrate to within a first temperature range, maintaining the semiconductor substrate within the first temperature range while the majority of the solvent evaporates from the solution, heating the semiconductor substrate to within a second temperature range that is above the first temperature range, maintaining the semiconductor substrate within the second temperature range until the monomers have polymerized to form the polymer coating and the polymers in the coating have cross-linked. The method further includes chemically mechanically polishing to form a planar upper surface comprising the polymer and, after the chemical-mechanical polishing, plasma etching that causes the polymer to become recessed within the trenches.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing an integrated circuit device, comprising:
    processing a wafer through a series of operations to form a topographically variable layer of a material on the wafer, wherein the topographically variable layer varies in height across the wafer;
    spin coating a monomer-containing solvent solution over a surface of the topographically variable layer;
    heating the wafer to within a first temperature range;
    maintaining the wafer within the first temperature range while a majority of the solvent evaporates from the solution;
    heating the wafer to within a second temperature range that is above the first temperature range;
    maintaining the wafer within the second temperature range until the monomers have polymerized to form a polymer coating and the polymers in the coating have cross-linked;
    performing chemical mechanical polishing (CMP) to remove a first portion of the polymer coating; and
    etching to effectuate a top-down recessing of the polymer coating.

2. The method of claim 1, wherein the heating of the wafer to within the first temperature range is heating the wafer on a hot plate within a chamber.

3. The method of claim 2, further comprising:
    while maintaining the wafer within the first temperature range and while the majority of the solvent is evaporating from the solution, exhausting the chamber from an outlet below the wafer.

4. The method of claim 2, further comprising:
    while maintaining the wafer within the first temperature range and while the majority of the solvent is evaporating from the solution, providing a gas flow through the chamber, wherein the gas flow enters the chamber from above the wafer and exits the chamber below the wafer.

5. The method of claim 4, wherein the gas flow exits the wafer through a port centered below the wafer.

6. The method of claim 1, wherein the etching to effectuate a top-down recessing of the polymer coating is etching with a low selectivity between the polymer and the material and effectuates a top-down recessing of the topographically variable layer.

7. The method of claim 1, wherein the chemical mechanical polishing stops on the topographically variable layer.

8. The method of claim 6, wherein the etching recesses the polymer coating and the topographically variable layer within a dielectric layer on the surface.

9. The method of claim 1, wherein the spin coating, the chemical mechanical polishing, and the etching take place within and form part of a replacement gate process.

10. The method of claim 1, wherein the topographically variable layer is a layer of a hard mask.

11. The method of claim 1, wherein the topographically variable layer is a work function metal that forms part of a metal gate electrode.

12. The method of claim 11, wherein the spin coating of the monomer-containing solvent solution places the solution in direct contact with the work function metal.

13. The method of claim 11, wherein the metal gate electrode is formed over one or more finFET fins.

14. The method of claim 1, further comprising:
    after the etching to effectuate a top-down recessing of the polymer coating, etching with a high selectivity between the material and the polymer coating to recess the topographically variable layer.

15. The method of claim 1, wherein the polymer coating is a photoresist.

16. The method of claim 1, wherein:
    the first temperature range is below a minimum temperature at which the polymer undergoes thermal cross-linking at a significant rate;
    the second temperature range is above the minimum temperature at which the polymer undergoes thermal cross-linking at the significant rate.

17. A method of manufacturing an integrated circuit device, comprising:
    forming a topographically variable layer of a material on a wafer, wherein the topographically variable layer varies in height across the wafer;
    coating a monomer-containing solvent solution over the topographically variable layer;
    heating the wafer on a hot plate in a chamber while a majority of the solvent evaporates from the solution coated over the topographically variable layer, the monomers in the solution form polymers, and the polymers cross-link to form a cross-linked polymer coating;
    while the majority of the solvent evaporates from the solution coated over the topographically variable layer, flowing a gas through the chamber, wherein the gas flow enters the chamber above the wafer and exits the chamber below the wafer;
    performing chemical mechanical polishing (CMP) to remove a first portion of the polymer coating; and
    etching to effectuate a top-down recessing of the polymer coating.

18. The method of claim 17, wherein the heating of the wafer on the hot plate in the chamber comprises:
    heating the wafer to within a first temperature range;
    maintaining the wafer within the first temperature range while the majority of the solvent evaporates from the solution;

heating the wafer to within a second temperature range that is above the first temperature range;

maintaining the wafer within the second temperature range until the monomers have polymerized to form a polymer coating and the polymers in the coating have cross-linked.

19. The method of claim 18, wherein:

the first temperature range is below a minimum temperature at which the polymer undergoes thermal cross-linking at a significant rate;

the second temperature range is above the minimum temperature at which the polymer undergoes thermal cross-linking at the significant rate.

20. A method of manufacturing an integrated circuit device, comprising:

forming finFETs having dummy gates having a height and wrapping fins on a semiconductor substrate;

forming a first dielectric layer that covers the semiconductor substrate and has a height at least equal to the height of the dummy gates;

removing the dummy gates to form trenches that are within the first dielectric layer;

forming a layer of a work function metal over a channel region of some of the fins, wherein the layer of the work function metal lines at least a portion of the length of at least some of the trenches, whereby the layer of the work function metal rises to the tops of the trenches at some locations;

forming a polymer coating above the layer of the work function metal, wherein the polymer fills the trenches and forming the polymer coating comprises:

spin coating with a monomer-containing solvent solution;

heating the semiconductor substrate within a first temperature range;

maintaining the semiconductor substrate within the first temperature range while a majority of the solvent evaporates from the solution;

heating the semiconductor substrate within a second temperature range that is above the first temperature range;

maintaining the semiconductor substrate within the second temperature range until the monomers have polymerized to form the polymer coating and the polymers in the coating have cross-linked;

performing chemical mechanical polishing (CMP) to form a planar upper surface comprising the polymer; and after the chemical-mechanical polishing, plasma etching, wherein the plasma etching causes the polymer to become recessed within the trenches.

\* \* \* \* \*